United States Patent
Xiong et al.

(10) Patent No.: US 9,379,533 B1
(45) Date of Patent: Jun. 28, 2016

(54) INPUT SURGE PROTECTION CIRCUIT AND METHOD FOR AN LED LOAD

(71) Applicant: Universal Lighting Technologies, Inc., Madison, AL (US)

(72) Inventors: Wei Xiong, Madison, AL (US); Rohan Dayal, Madison, AL (US)

(73) Assignee: Universal Lighting Technologies, Inc., Madison, AL (US)

( * ) Notice: Subject to any disclaimer, the term of this patent is extended or adjusted under 35 U.S.C. 154(b) by 0 days.

(21) Appl. No.: 14/552,037

(22) Filed: Nov. 24, 2014

Related U.S. Application Data

(60) Provisional application No. 62/040,468, filed on Aug. 22, 2014.

(51) Int. Cl.
| | |
|---|---|
| H05B 41/24 | (2006.01) |
| H02H 3/08 | (2006.01) |
| H05K 9/00 | (2006.01) |
| H05B 33/08 | (2006.01) |

(52) U.S. Cl.
CPC ............. *H02H 3/08* (2013.01); *H05B 33/0815* (2013.01); *H05K 9/00* (2013.01)

(58) Field of Classification Search
CPC .. H05B 33/0815; H05B 33/083; H05B 37/02; H02H 3/08
USPC ............ 315/291, 186, 246, 160, 175; 361/56, 361/111, 118
See application file for complete search history.

(56) References Cited

U.S. PATENT DOCUMENTS

| | | | | | |
|---|---|---|---|---|---|
| 5,940,259 | A | * | 8/1999 | Robinson ............... | H02H 9/042 361/111 |
| 2010/0013402 | A1 | * | 1/2010 | Chaffai .............. | H05B 33/0815 315/291 |
| 2011/0121654 | A1 | * | 5/2011 | Recker ............... | H05B 37/0272 307/66 |
| 2012/0080944 | A1 | * | 4/2012 | Recker ...................... | H02J 9/02 307/25 |
| 2013/0278157 | A1 | * | 10/2013 | Radermacher ..... | H05B 33/0812 315/186 |
| 2014/0240966 | A1 | * | 8/2014 | Garcia ...................... | F21S 9/02 362/183 |

* cited by examiner

*Primary Examiner* — Douglas W Owens
*Assistant Examiner* — Syed M Kaiser
(74) *Attorney, Agent, or Firm* — Patterson Intellectual Property Law, P.C.; Mark J. Patterson; Gary L. Montle

(57) ABSTRACT

A light fixture includes a surge protection circuit for a non-isolated DC-DC converter. The converter is coupled to a circuit ground and further provides output power to a light source chassis configured to house a light source. The chassis is coupled to earth ground. The surge protection circuit includes a voltage triggering device having a breakdown voltage value and coupled to either the circuit ground or an output of the converter. A first capacitor is coupled in series between the voltage triggering device and the earth ground, and a second capacitor is coupled in parallel with the voltage triggering device. The first capacitor is configured with a sufficiently large capacitance wherein a voltage across the first capacitor, and likewise a voltage between the chassis and the earth ground, is effectively clamped to a light source threshold value during a surge condition.

13 Claims, 4 Drawing Sheets

INPUT SURGE PROTECTION CIRCUIT AND METHOD FOR AN LED LOAD

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of U.S. Provisional Patent Application No. 62/040,468, filed Aug. 22, 2014, and which is hereby incorporated by reference in its entirety.

BACKGROUND OF THE INVENTION

The present invention relates generally to LED driver circuits. More particularly, the present invention relates to non-isolated LED drivers with circuitry designed to control the voltage between an LED load and earth ground during input surge conditions.

Generally stated, non-isolated lighting circuits such as LED drivers may be desirable in many applications at least because they are smaller in size, lower cost and provide a higher efficiency as compared, for example, to isolated LED drivers.

Referring to FIG. 1, one example of a topology of a light fixture implementing a non-isolated LED lighting circuit or driver 10 is shown. V_in_AC is the AC input voltage source. An EMI filtering circuit includes L_common and L_diff as inductive elements and C_x is an EMI filter capacitor. C1 is a high frequency filter capacitor. Diodes D1-D4 form a diode bridge that rectifies the AC input from the EMI filtering circuit into a DC voltage. A non-isolated DC-DC converter 12 is used to control the LED current. The rectifier formed by diodes D1-D4 and the DC-DC converter 12 are coupled to circuit ground GND_main.

A surge protection circuit includes two clamping devices such as Metal-Oxide Varistors (MOV), which are used to protect the lighting circuit 10 on its input end from surge damage. A first clamping device MOV1 is connected between line and neutral inputs to clamp the input voltage to a certain value when a high voltage surge happens between the line and neutral inputs. A second clamping device MOV2 is connected between earth ground and neutral to clamp the input voltage between the earth ground, neutral and line inputs when the high voltage surge happens between line-neutral-earth ground.

A light source such as an LED load 14 is connected to receive an output current from the non-isolated DC-DC converter 12. Typically the chassis 16 of the LED load 14 will be grounded to earth 18, particularly for applications such as an outdoor LED lighting fixture. Between the LED load 14 and earth ground 18 there is accordingly an electrically equivalent tiny capacitance.

Therefore, when a surge voltage appears across line or neutral inputs and earth ground, all of the voltage as clamped by the second clamping device MOV2 will be forced across the LED body to earth ground. As shown in the example of FIG. 1, the clamped surge voltage is represented by V_surge. Because the clamping device MOV2 may typically be clamped to a value of at least 1 kV for 120-480 volt (V) input applications, the voltage across the LED load body and chassis will accordingly be at least 1 kV when such a surge occurs.

A voltage of this magnitude can easily damage the LED engine during input surge conditions such as, for example, may occur from a lightning surge. This is a destructive drawback that limits the practical application of non-isolated DC-DC converter in LED drivers, particularly outdoor applications of drivers.

An ideal MOV or TVS (Transient Voltage Suppressor) could be connected between the LED input and chassis earth ground to limit the voltage across these components when a surge happens. However, each of these solutions presents problems of their own.

The normal operating RMS voltage of an MOV is typically two or three times lower than the clamping voltage. As a result, to set a clamping voltage of an MOV to a sufficiently small value, i.e. 500V, the normal operating voltage would be 100V-200V, which may be lower than the input voltage in certain applications. If the normal operating voltage of a MOV is less than the input voltage of the LED driver, the leakage current of a MOV may be large enough to overheat the MOV and cause it to fail during a normal operating condition.

A TVS can have the same clamping voltage and normal operating voltage. But for a high voltage TVS, the surge current capability is very limited, in fact providing much less than that offered by the MOV. Therefore, a TVS cannot be reasonably implemented for this type of protection circuit either.

It would therefore be desirable to provide a surge protection circuit which could reliably clamp the voltage between an LED load and an associated chassis ground to a low value, such that non-isolated DC-DC converters can be effectively implemented as a topology for LED driver applications.

BRIEF SUMMARY OF THE INVENTION

An LED surge protection circuit as disclosed herein works effectively for non-isolated LED driver topologies and can dramatically reduce the size and cost of an LED driver.

In accordance with the present invention, an exemplary embodiment of a light fixture may be provided with a light source chassis configured to receive current for driving a light source disposed in or on the fixture, and further configured for coupling to an earth ground. A ballast provides current to the light source from an alternating current (AC) power source having first and second input connections. The ballast includes a filtering circuit with one or more inductive elements coupled to the AC source, an input rectifier configured to provide a direct current (DC) power source and coupled to a circuit ground, and a power converter having an input and an output. The input is configured to connect to a power rail and the ground of the DC power source. A first surge protection circuit includes a first clamping device coupled between the first and second input connections for the AC power source, and a second clamping device coupled between the first or second input connection and the earth ground.

A second surge protection circuit includes a series circuit of a first capacitor and a voltage triggering device having a breakdown voltage value. The second surge protection circuit is coupled on one end to the earth ground and is configured to clamp a voltage between the light source and the earth ground to a light source threshold value associated with a capacitance value of the first capacitor during a surge condition.

In an exemplary aspect of a light fixture as disclosed herein, a clamping voltage of the second clamping device may be greater than the breakdown voltage value of the voltage triggering device. Also, during a surge condition associated with activation of the second clamping device and the voltage triggering device, the first capacitor of the second surge protection circuit is electrically connected in series with the one or more inductive elements of the filtering circuit.

In another exemplary aspect of a light fixture as disclosed herein, the surge protection circuit is coupled on a second end to either of the output of the DC-DC converter, or the circuit ground of the DC power source.

In a further exemplary aspect of a light fixture as disclosed herein, the surge protection circuit further includes a second capacitor coupled in parallel with the voltage triggering device.

In yet another exemplary aspect of a light fixture as disclosed herein, a capacitance value of the second capacitor is selected based upon an impedance value of the voltage triggering device during normal operation to prevent false triggering of the voltage triggering device.

In another exemplary aspect of a light fixture as disclosed herein, the voltage triggering device is a spark gap.

DETAILED DESCRIPTION OF THE INVENTION

Figure 1:
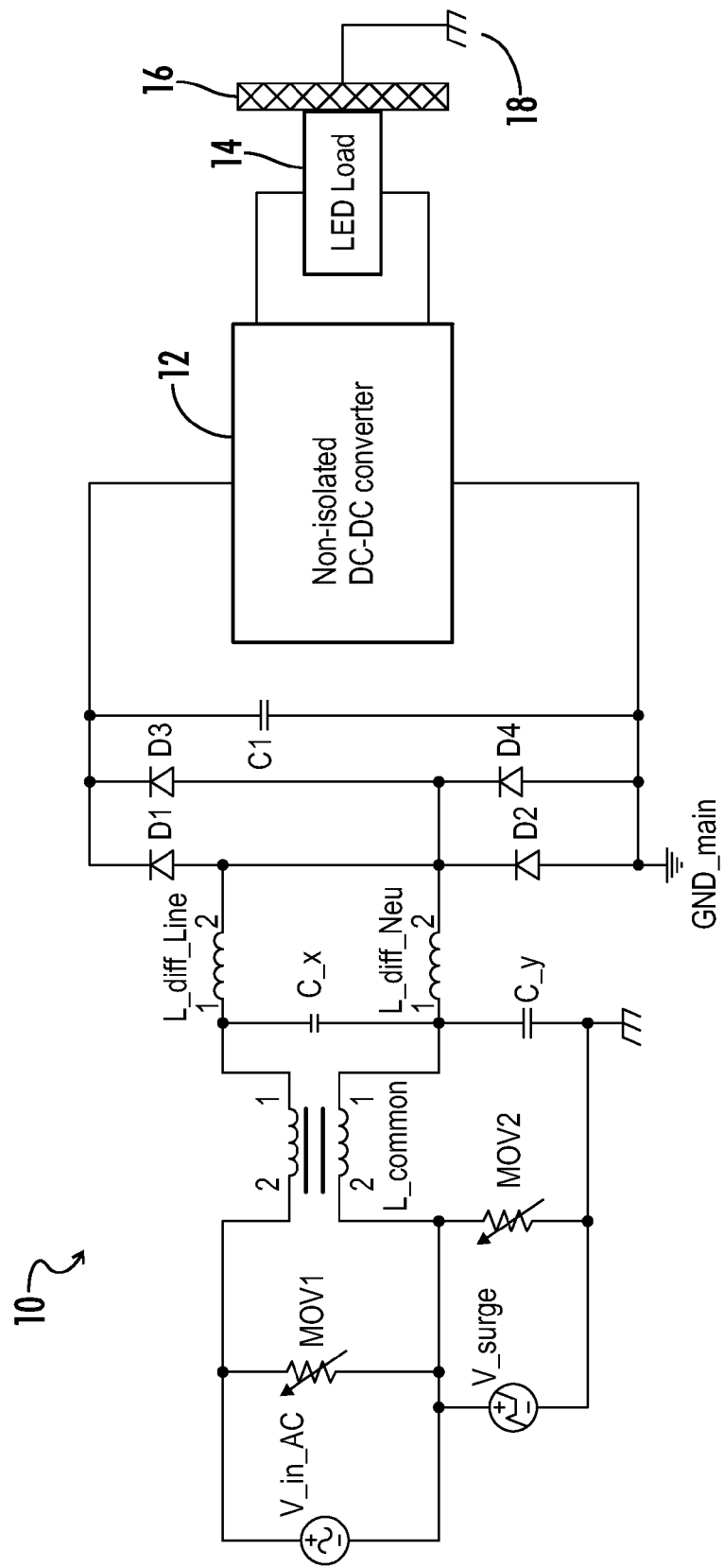
FIG. 1 is a circuit block diagram representing one conventional example of an LED driver circuit implementing a non-isolated DC-DC converter.

To facilitate the understanding of the embodiments described herein, a number of terms are defined below. The terms defined herein have meanings as commonly understood by a person of ordinary skill in the areas relevant to the present invention. Terms such as "a," "an," and "the" are not intended to refer to only a singular entity, but rather include the general class of which a specific example may be used for illustration. The terminology herein is used to describe specific embodiments of the invention, but their usage does not delimit the invention, except as set forth in the claims.

As used herein, "ballast" refers to any circuit for providing power from a power source to a light source. Additionally, "light source" refers to one or more light emitting devices such as fluorescent lamps, high intensity discharge lamps, incandescent bulbs, and solid state light-emitting elements such as LEDs, organic light emitting diodes, and plasmaloids.

The term "coupled" means at least either a direct electrical connection between the connected items or an indirect connection through one or more passive or active intermediary devices.

The term "circuit" means at least either a single component or a multiplicity of components, either active and/or passive, that are coupled together to provide a desired function. Terms such as "wire," "wiring," "line," "signal," "conductor," and "bus" may be used to refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

The "DC-DC converter" as described herein may unless otherwise defined with respect to a particular topology make reference to any type of buck, buck-boost, boost, or various other forms of power conversion as known to one of skill in the art for use in lighting applications as otherwise disclosed herein.

Terms such as "providing," "processing," "supplying," "determining," "calculating" or the like may refer at least to an action of a computer system, computer program, signal processor, logic or alternative analog or digital electronic device that may be transformative of signals represented as physical quantities, whether automatically or manually initiated.

The terms "controller," "control circuit" and "control circuitry" as used herein may refer to, be embodied by or otherwise included within a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed and programmed to perform or cause the performance of the functions described herein. A general purpose processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Figure 2:
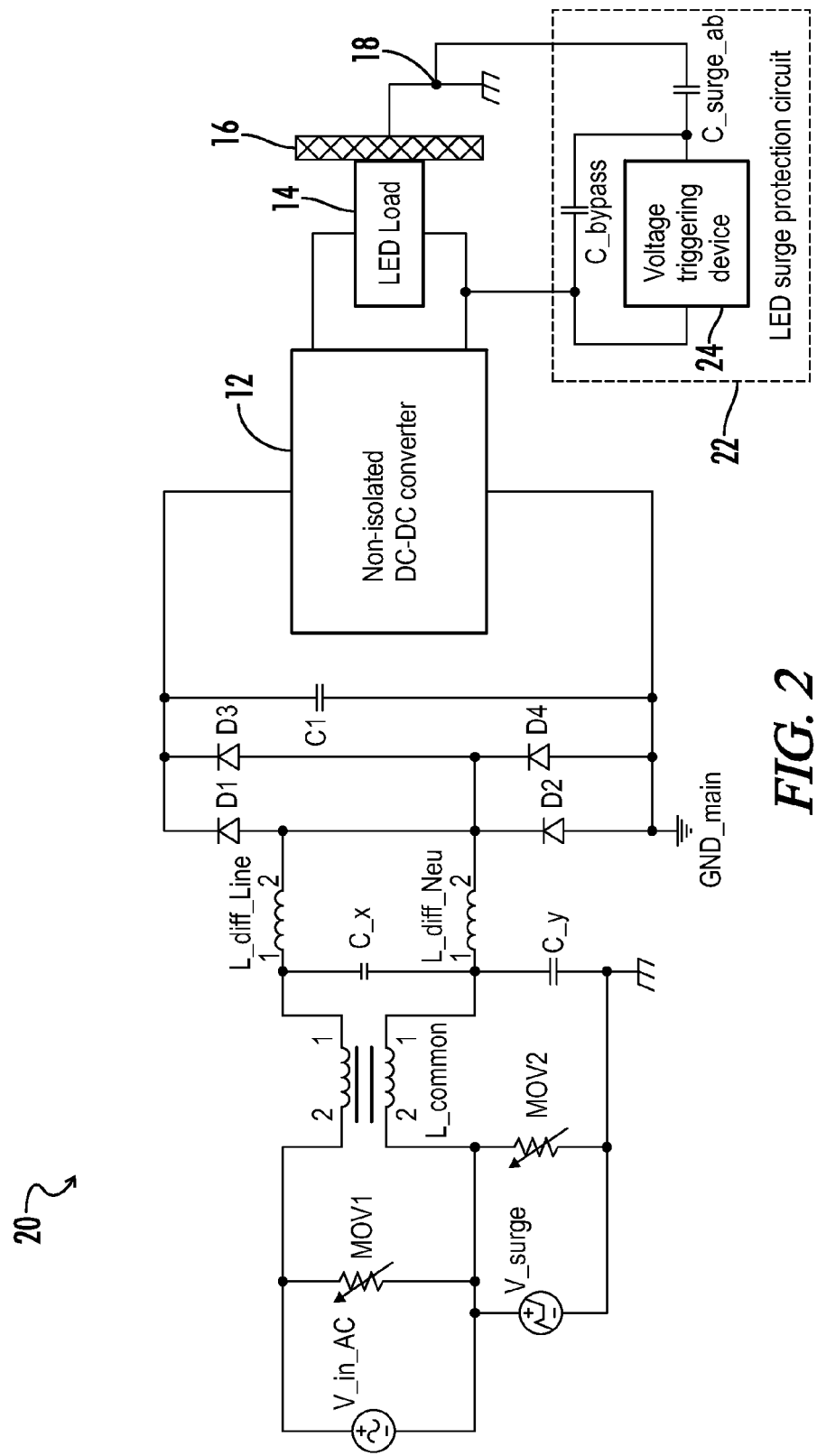
FIG. 2 is a circuit block diagram representing one embodiment of an LED driver circuit with an LED surge protection circuit as disclosed herein.
Figure 3:
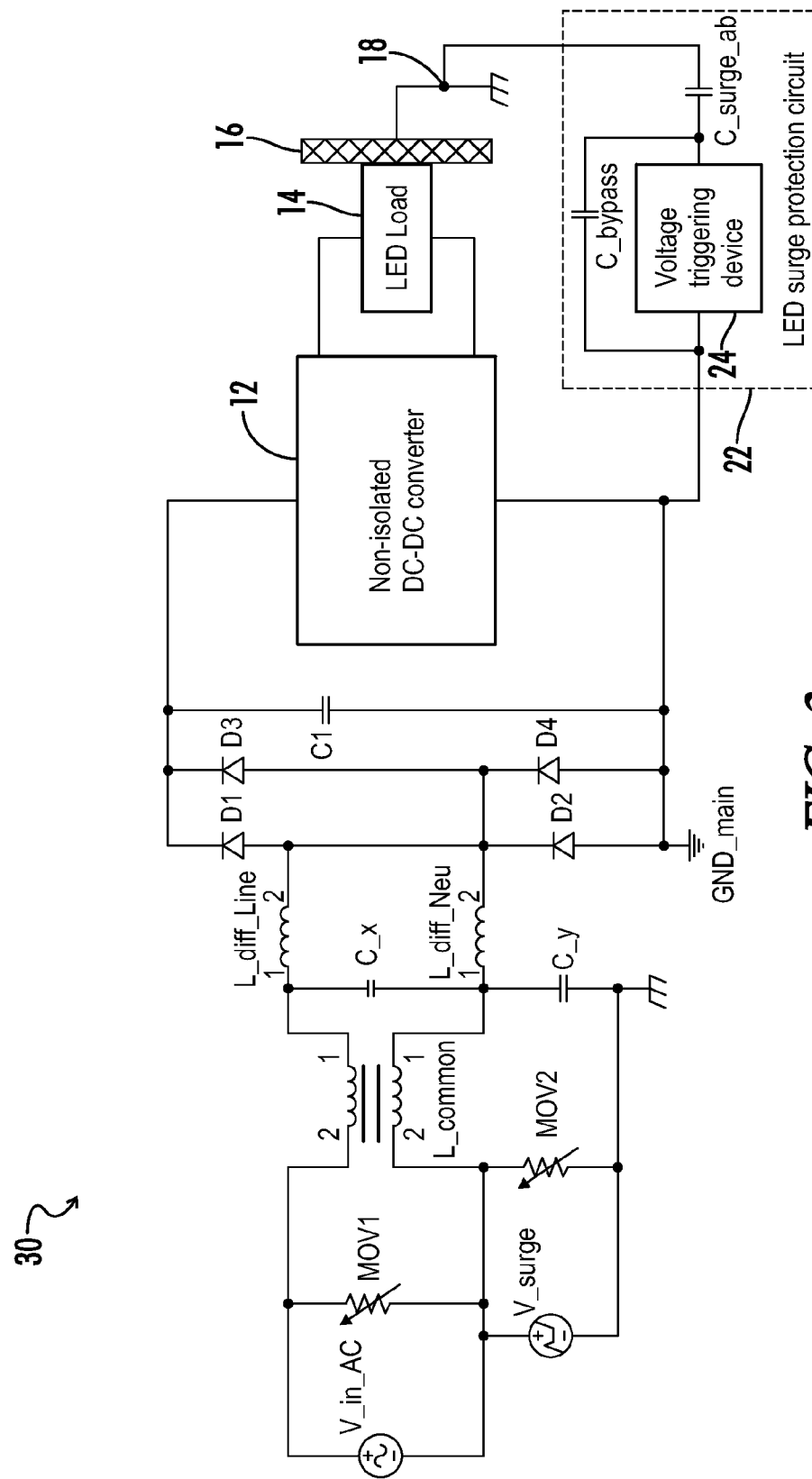
FIG. 3 is a circuit block diagram representing another embodiment of an LED driver circuit with an LED surge protection circuit as disclosed herein.
Figure 4:
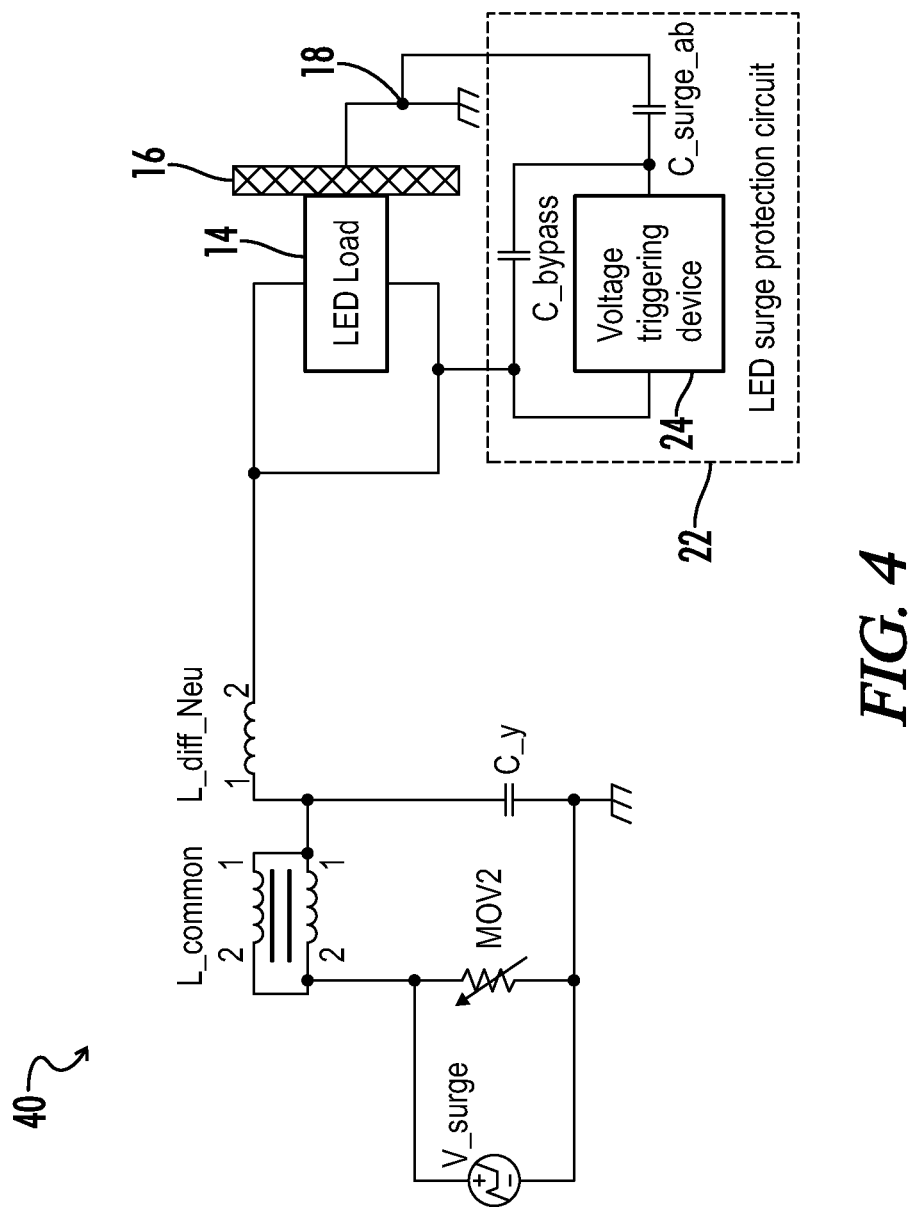
FIG. 4 is a circuit block diagram representing an equivalent circuit for various embodiments of an LED driver circuit as disclosed herein during a surge voltage condition.

Referring generally to FIGS. 2-4, embodiments of a lighting ballast implementing a non-isolated DC-DC converter with surge protection circuitry may now be described. Where the various figures may describe embodiments sharing various common elements and features with other embodiments, similar elements and features are given the same reference numerals and redundant description thereof may be omitted below.

Referring first to an exemplary embodiment of an LED driver 20 as represented in FIG. 2, an LED surge protection circuit 22 is added to the conventional example of a non-isolated LED driver as previously described. A voltage triggering device 24 is connected in parallel with a bypass capacitor C_bypass and then in series with a surge current absorbing capacitor C_surge_ab. The voltage triggering device 24 may be a spark gap or other diac-like high power device, characterized in exemplary form such that it will act like a short circuit when the voltage across it reaches a breakdown voltage of the device. The surge absorbing capacitor C_surge_ab is coupled on a first end to earth ground 18, and on a second end to the voltage triggering device 24. The opposing end of the voltage triggering device 24 and the bypass capacitor C_bypass, or alternatively stated a second end of the surge protection circuit 22, is coupled to an output of the non-isolated DC-DC converter 12.

Another exemplary embodiment of an LED driver 30 is represented in FIG. 3. The surge absorbing capacitor is coupled to earth ground, but the opposing end of the voltage triggering device 24 and the bypass capacitor C_bypass are now coupled to circuit ground GND_main.

An equivalent circuit 40 is shown in FIG. 4 representing the occurrence of a surge between line and neutral to earth ground. In such a condition, the clamping device MOV2 will be activated and clamp the surge value first at a certain value, which may typically be much higher than what we would expect for the voltage between the LED load 14 to earth ground 18, or alternatively higher than a rated threshold value for the lighting source at issue. The inductive elements L_common and L_diff are equivalently connected in series with the LED surge protection circuit 22. When the surge condition occurs, the clamping voltage of the clamping device MOV2 will be much higher than the breakdown voltage of the voltage triggering device 22. This high voltage will activate/trigger the device MOV2, wherein the device will act like a short circuit. The inductive elements L_common, L_diff and the surge absorbing capacitor C_surge_ab are electrically coupled in series when the surge condition occurs. The voltage across the surge absorbing capacitor C_surge_ab will be the voltage across the LED load 14 and earth ground 18. The voltage across the surge absorbing capacitor C_surge_ab may be determined as follows:

$$V_{C\_surge\_ab} = V_{\_mov2\_clamping} \cdot \left| \frac{\frac{1}{j \cdot \omega \cdot C_{surge\_ab}}}{j \cdot \omega \cdot (L_{common} + L_{diff}) + \frac{1}{j \cdot \omega \cdot C_{surge\_ab}}} \right|$$

If the resonant frequency of the circuit including the inductive elements L_common+L_diff and the surge absorbing capacitor C_surge_ab is much less than the surge voltage frequency, most of the voltage will be provided across the inductive elements L_common and L_diff. In other words, if the surge absorbing capacitor C_surge_ab is designed to be large enough the voltage across this capacitor will be relatively small, as well as the voltage across the LED load and earth ground.

In various embodiments, the bypass capacitor C_bypass may be implemented to help bypass high frequency noise going into the voltage triggering device. This component may however be considered as optional if the impedance of the voltage triggering device is sufficiently large during normal operating conditions.

Another desirable feature of the LED driver using surge protection circuitry as disclosed herein is that the surge absorbing capacitor C_surge_ab may help turn off the voltage triggering device after the surge condition has lapsed by limiting the current going through the device.

The previous detailed description has been provided for the purposes of illustration and description. Thus, although there have been described particular embodiments of an invention, it is not intended that such references be construed as limitations upon the scope of this invention except as set forth in the following claims.

What is claimed is:

1. A light fixture comprising:
    a non-isolated DC-DC power converter having an input connected to circuit ground of a DC power source and further configured to provide an output to drive a light source;
    a chassis configured to house the light source and to be coupled to earth ground; and
    a surge protection circuit comprising
        a series circuit of a first capacitor and a voltage triggering device having a breakdown voltage value,
        a second capacitor coupled in parallel with the voltage triggering device,
        the surge protection circuit is coupled on one end to earth ground and is configured to clamp a voltage between the light source and the earth ground to a light source threshold value associated with a capacitance value of the first capacitor during a surge condition;
        the surge protection circuit is coupled on a second end to the output of the DC-DC converter, and
        wherein a capacitance value of the second capacitor is selected based upon an impedance value of the voltage triggering device during normal operation to prevent false triggering of the voltage triggering device.

2. The light fixture of claim 1, wherein respective first ends of the voltage triggering device and the second capacitor are coupled to the output of the DC-DC converter.

3. The light fixture of claim 1, wherein the voltage triggering device comprises a spark gap.

4. A light fixture comprising:
    a non-isolated DC-DC power converter having an input connected to circuit ground of a DC power source and further configured to provide an output to drive a light source;
    a chassis configured to house the light source and to be coupled to earth ground; and
    a surge protection circuit comprising
        a series circuit of a first capacitor and a voltage triggering device having a breakdown voltage value,
        the surge protection circuit is coupled on one end to earth ground and is configured to clamp a voltage between the light source and the earth ground to a light source threshold value associated with a capacitance value of the first capacitor during a surge condition,
        a second capacitor coupled in parallel with the voltage triggering device,
        the surge protection circuit is coupled on a second end to the circuit ground of the DC power source, and
        wherein a capacitance value of the second capacitor is selected based upon an impedance value of the voltage triggering device during normal operation to prevent false triggering of the voltage triggering device.

5. The light fixture of claim 4, wherein respective first ends of the voltage triggering device and the second capacitor are coupled to the circuit ground of the DC power source.

6. The light fixture of claim 4, wherein the voltage triggering device comprises a spark gap.

7. A light fixture comprising:
    a light source chassis configured to receive current for driving a light source disposed within said chassis, and further coupled to an earth ground;
    a ballast circuit operable to provide current to the light source from an alternating current (AC) power source having first and second input connections, the ballast circuit comprising
        a filtering circuit connected to the AC power source and comprising one or more inductive elements, an input rectifier connected to the filtering circuit and configured to provide a direct current (DC) power source having a power rail and a ground at an output of the input rectifier, and a power converter having an input and an output, wherein the input is configured to connect to the power rail and the ground of the DC power source;

a first surge protection circuit comprising a first clamping device coupled between the first and second input connections for the AC power source, and a second clamping device coupled between the first or second input connection and the earth ground;

a second surge protection circuit comprising a series circuit of a first capacitor and a voltage triggering device having a breakdown voltage value, the surge protection circuit coupled on one end to the earth ground and configured to clamp a voltage between the light source and the earth ground to a light source threshold value associated with a capacitance value of the first capacitor during a surge condition;

wherein a clamping voltage of the second clamping device is greater than the breakdown voltage value of the voltage triggering device; and wherein during a surge condition associated with activation of the second clamping device and the voltage triggering device, the first capacitor of the second surge protection circuit is electrically connected in series with the one or more inductive elements of the filtering circuit.

8. The light fixture of claim 7, wherein the second surge protection circuit is coupled on a second end to the output of the DC-DC converter.

9. The light fixture of claim 8, the second surge protection circuit further comprising a second capacitor coupled in parallel with the voltage triggering device.

10. The light fixture of claim 8, wherein a capacitance value of the second capacitor is selected based upon an impedance value of the voltage triggering device during normal operation to prevent false triggering of the voltage triggering device.

11. The light fixture of claim 7, wherein the first surge protection circuit is coupled on a second end to the circuit ground of the DC power source.

12. The light fixture of claim 4, wherein the second surge protection circuit further comprises a second capacitor coupled in parallel with the voltage triggering device.

13. The light fixture of claim 12, wherein a capacitance value of the second capacitor is selected based upon an impedance value of the voltage triggering device during normal operation to prevent false triggering of the voltage triggering device.

* * * * *